(12) United States Patent
Aida

(10) Patent No.: US 7,241,490 B2
(45) Date of Patent: *Jul. 10, 2007

(54) METALLIZED POLYIMIDE FILM AND MANUFACTURING METHOD THEREFOR

(75) Inventor: Masayuki Aida, Aizuwakamatsu (JP)

(73) Assignee: Mitsubishi Shindoh Co., Ltd., Tokyo (JP)

( * ) Notice: Subject to any disclaimer, the term of this patent is extended or adjusted under 35 U.S.C. 154(b) by 10 days.

This patent is subject to a terminal disclaimer.

(21) Appl. No.: 11/044,760

(22) Filed: Jan. 26, 2005

(65) Prior Publication Data

US 2005/0214551 A1    Sep. 29, 2005

(30) Foreign Application Priority Data

Feb. 4, 2004    (JP) .............................. 2004-027660

(51) Int. Cl.
*B32B 15/08*    (2006.01)
*B05D 3/00*    (2006.01)

(52) U.S. Cl. .................... 428/323; 428/328; 428/330; 428/331; 428/458; 428/473.5; 427/532; 427/533; 427/535; 427/536; 427/537; 427/547; 427/551

(58) Field of Classification Search ................. 428/323
See application file for complete search history.

(56) References Cited

U.S. PATENT DOCUMENTS 6,767,644 B2 *   7/2004   Aida .................... 428/473.5
6,812,164 B2 *  11/2004   Yamaguchi et al. ......... 438/788

FOREIGN PATENT DOCUMENTS

JP      2003-011273        1/2003

* cited by examiner

*Primary Examiner*—Monique R. Jackson
(74) *Attorney, Agent, or Firm*—Kolisch Hartwell, PC

(57) ABSTRACT

A metallized polyimide film includes: a polyimide film; an intermediate layer formed in the polyimide film, the intermediate layer extending 20 nm or less from a surface of the polyimide film, and the intermediate layer including at least one element selected from the group consisting of Mo, Cr, Ni, and Si injected into the polyimide film; and a conductive layer that is made of copper or a copper alloy formed on the intermediate layer, wherein the amount of the at least one element injected into the intermediate layer is between 0.3 and 15 mg/m².

10 Claims, 4 Drawing Sheets

METALLIZED POLYIMIDE FILM AND MANUFACTURING METHOD THEREFOR

BACKGROUND OF THE INVENTION

1. Field of the Invention

The present invention relates to a metallized polyimide film that includes a polyimide film and a conductive film made of copper or a copper alloy formed on the surface of the polyimide film. The present invention also relates to a method of manufacturing therefor.

Priority is claimed on Japanese Patent Application No. 2004-27660, filed Feb. 4, 2004, the content of which is incorporated herein by reference.

2. Description of Related Art

In recent years, in order to achieve reduction in the size and weight of electronic apparatuses and enhancement of the flexibility of the structure, there has been a growing demand for tape automated bonding (TAB) tapes, flexible circuit boards, flexible wiring boards, and the like. As substrates of these boards, flexible plastic substrates having a copper foil bonded thereon using adhesives, such as epoxy adhesive, have been employed conventionally. However, the demand for high-density packaging of electronic apparatuses has required further reduction in the thickness of these substrates. However, the above-described flexible plastic substrates that are bonded with copper foil cannot meet this requirement for reducing the thickness.

In addition, the above-described circuit board using adhesive has several shortcomings as follows:

(1) An etching solution that is used in an etching of a copper foil easily migrates into an adhesive layer. When bias is applied under a high temperature and high humidity condition, copper may migrate to a plastic substrate, resulting in short-circuiting.
(2) For enhancing the operating speed, both impedance matching and reduction in crosstalk are required, both of which are difficult to achieve when an adhesive is used.
(3) The adhesive layer has poor dimensional stability.
(4) It is difficult to achieve high-density packaging since small patterns cannot be formed on a circuit board having the adhesive layer.
(5) The adhesive layer exhibits poor heat stability since the adhesive has inferior thermal properties compared to those of the material of a plastic substrate, which makes high-density packaging difficult.
(6) The circuit board easily deforms due to the adhesive.

In order to solve these problems, new techniques for forming a metallized film without using an adhesive have been studied. Several such techniques are known. For example, in one method, a metal thin film is formed directly on a plastic film according to circuit patterns using thin film formation techniques, including vacuum evaporation, sputtering, ion plating, or the like. Then, a metal plating layer is formed on the metal thin film using electroplating or the like. In another method, a metal thin film is formed on the surface of a plastic substrate, and then a metal is deposited using electroplating or the like. The conductive layer is etched to define circuit patterns.

However, these methods also have shortcomings. In a polyimide film having an excellent heat resistance, the bonding strength between the polyimide film and a metal is weaker than the bonding strength between the metal and other plastics. Thus, the bonding strength between the polyimide film and the metal thin film is reduced after the circuit pattern formation or the electroplating process is carried out, which may often result in peeling off.

Other methods have been used; for example, in one method, a polyimide monomer is coated on a copper foil and then heat cured to form a polyimide layer. In another method, a thermoplastic polyimide film and a copper foil are bonded together using the heat seal technique. However, these methods have shortcomings in that the surface roughness of a metallized polyimide film is affected by the surface roughness of the copper foil employed, which may adversely affect a fine pattern formation process. In addition, since there is a limit to reducing the thickness of copper foils, it is difficult to achieve reduction in thickness.

In order to address these shortcomings, the present inventor proposed a metallized polyimide film including a polyimide film, a metal nucleus adhesion region formed on the surface of the polyimide film, and a metal layer formed on the surface of the metal nucleus adhesion region, which are disclosed in Japanese Unexamined Patent Application, First Publication No. 2003-011273. The metal nucleus adhesion region is made of at least one metal selected from the group consisting of Mo, Cr, Ni, Si, Fe, and Al.

As applications of metallized polyimide films has become widespread, the metallized polyimide films are used in harsher environments, which has created the demands for metallized polyimide films that exhibit a better peel resistance.

SUMMARY OF THE INVENTION

The present invention was conceived in light of the above-described background, and an object thereof is to provide a metallized polyimide film that can maintain an excellent bonding strength between a conductive layer and a polyimide film at high temperatures.

The metallized polyimide film according to the present invention includes: a polyimide film; an intermediate layer formed in the polyimide film, the intermediate layer extending 20 nm or less from a surface of the polyimide film, and the intermediate layer including at least one element selected from the group consisting of Mo, Cr, Ni, and Si injected into the polyimide film; and a conductive layer that is made of copper or a copper alloy formed on the intermediate layer, wherein the amount of the at least one element injected into the intermediate layer is between 0.3 and 15 mg/m$^2$. The metallized polyimide film may be a TAB tape or a flexible circuit board.

The method for manufacturing a metallized polyimide film according to the present invention includes the steps of: providing a polyimide film; forming an intermediate layer by sputtering particles from a target containing at least one element selected from the group consisting of Mo, Cr, Ni, and Si, and then injecting the sputtered particles into the polyimide film to a depth within 20 nm from a surface of the polyimide film, the amount of the at least one element injected into the intermediate layer being between 0.3 and 15 mg/m$^2$; and forming a conductive layer that is made of copper or a copper alloy on the intermediate layer.

According to the present invention, by providing an intermediate layer into which at least one element selected from the group consisting of Mo, Cr, Ni, and Si is injected in a region in the polyimide film that is adjacent to the surface thereof, it is possible to enhance the adhesion between the intermediate layer and the polyimide film. Accordingly, it is possible to prevent peeling off of the conductive layer from the polyimide film, and a high reliability is ensured.

DETAILED DESCRIPTION OF THE INVENTION

Figure 1:
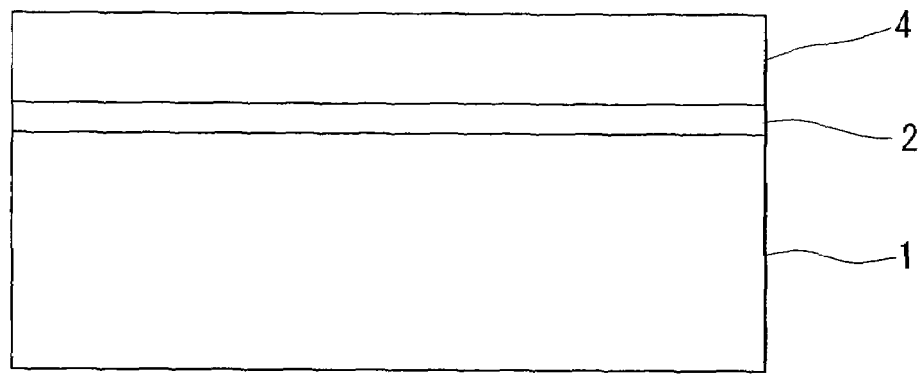
FIG. 1 is a cross-sectional view illustrating one embodiment of a metallized polyimide film according to the present invention.

FIG. 1 is a cross-sectional view illustrating one embodiment of a metallized polyimide film according to the present invention. The metallized polyimide film includes a polyimide film 1, an intermediate layer 2 formed on one side of the polyimide film 1, and a conductive layer 4 formed on the intermediate layer 2.

The polyimide film 1 may be made of any polyimide resins that are used for metallized polyimide films in the art, and may be a biphenyl tetracarboxylic dianhydride (BPDA) based polyimide resin or a pyromellitic dianhydride (PMDA) based polyimide resin. In general, a polyimide film derived from BPDA (e.g., "Upilex" that is commercially available from UBE Industries, Ltd., or the like) exhibits excellent dimensional stabilities over temperature and moisture absorption and high rigidity, and is primarily used for TAB. The bonding strength of a BPDA-based polyimide film with a metal thin film, however, is weak. In contrast, it is considered that a polyimide film derived from PMDA (e.g., "Kapton" that is commercially available from Du Pont-Toray Co., Ltd., or "APLICAL" that is commercially available from Kaneka Corporation) exhibits an excellent bonding strength with a metal thin film. The polyimide film 1 preferably has a thickness of between 12 μm and 125 μm although the present invention is not limited to this thickness range.

The polyimide film 1 may be a single-layered film, or may have a multilayered structure in which films made of polyimide resins in different kinds are stacked together. In the latter case, the side of the polyimide film 1 on which the intermediate layer 2 is attached may be a BPDA-based or PMDA-based polyimide resin, and both a BPDA-based and a PMDA-based polyimide resins provide similar effects.

The intermediate layer 2 has a composite structure in which particles made of at least one element selected from the group consisting of Mo, Cr, Ni, and Si are dispersed in the polyimide in a region within 20 nm from a surface of the polyimide film 1 (hereinafter, the at least one element is referred to as the "injected element" and the region is referred to as the "element injection region").

Figure 2:
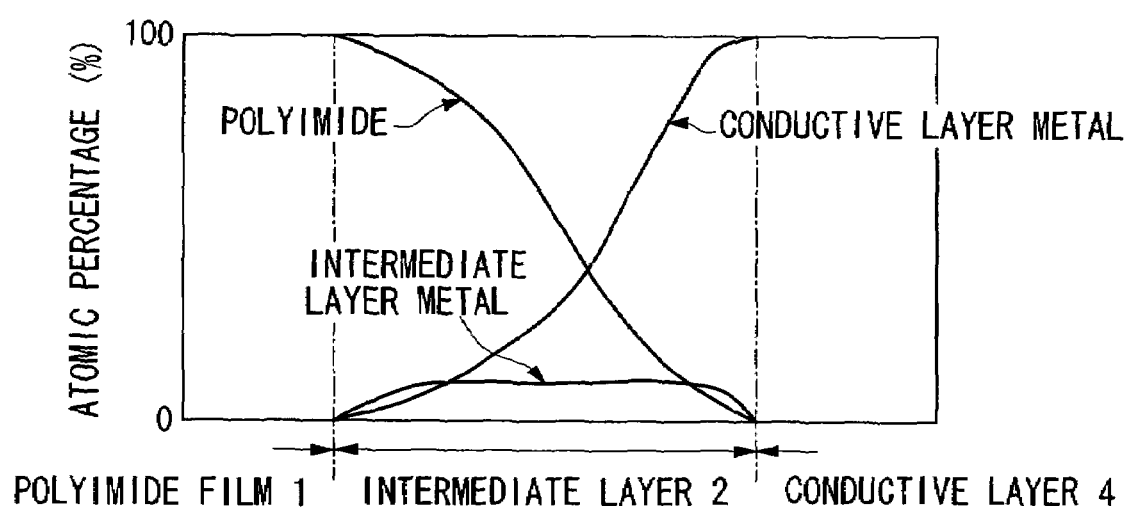
FIG. 2 is a graph illustrating the concentration profiles of elements in a region near the intermediate layer in the metallized polyimide film shown in FIG. 1.

FIG. 2 is a graph schematically illustrating the concentration profiles of various materials in the intermediate layer 2. The concentration of the polyimide in the intermediate layer 2 varies from about 100% at the boundary with the polyimide film 1 to 0% at the boundary with the conductive layer 4. The concentration of the conductive metal element in the intermediate layer 2 varies from about 0% at the boundary with the polyimide film 1 to 100% at the boundary with the conductive layer 4. The concentration of the injected element in the intermediate layer 2 increases from about 0% at the boundary with the polyimide film 1, reaches the maximum, then decreases to 0% at the boundary with the conductive layer 4. The concentration of the injected element will never be 100% even when it reaches the maximum. The maximum concentration of the injected element is not particularly limited, but is preferably 20% or lower.

To form the above-described intermediate layer 2, the surface of the polyimide film 1 is made rough by an etching treatment to activate the polyimide surface. By carrying out the etching treatment on the polyimide film 1, it is possible to inject the injected element deeper in a process that will be carried out later.

The etching treatment may be either the wet etching or may be the dry etching. In the wet etching treatment, the surface of the polyimide film 1 is corroded using a corrosive solution, for example, to make the surface rough. Examples of the corrosive solution include a mixed solution containing, for example, sodium hydrate, hydrazine hydrate, ethanediamine, or the like.

For dry etching, various dry etching techniques may be used. Among them, plasma etching under a vacuum is especially preferable, and inline processing is more preferable in which the intermediate layer 2 is formed on the etched surface after the etching process without breaking the vacuum. By accelerating particles of the intermediate layer metal and bombarding the activated polyimide surface with the accelerated particles, particles of the injected element can be injected into the polyimide base by the impact when the particles collide against the surface of the polyimide film.

The amount of the injected element in the intermediate layer 2 is preferably between 0.3 and 15 mg/m$^2$ per unit area of the polyimide film 1, and is more preferably between 0.9 and 10 mg/m$^2$. The amount of the injected element is preferably equivalent to the amount required to deposit a film of the element on a smooth surface to a thickness of between 0.5 and 5 nm. Since the intermediate layer 2 is formed by injecting such a small amount of the injected element into a region having the above-described depth with a high energy and dispersing the element, the intermediate layer 2 is not a dense metal film. It should be noted that the intermediate layer 2 and the conductive layer 4 are patterned in advance into desired patterns.

If the amount of the injected element in the intermediate layer 2 is less than 0.3 mg/m$^2$, a sufficiently strong bonding cannot be obtained between the polyimide film 1 and the conductive layer 4. If the amount of the injected element is more than 15 mg/m$^2$, irregularities in the structure of the element injection region of the polyimide film 1 becomes significant. As a result, the structure of the element injection region may be destroyed, which may result in the deterioration of the adhesion of the conductive layer 4. Furthermore, for etching the conductive layer 4 in order to pattern the layer, the intermediate layer 2 is required to be etched along with the conductive layer 4. Therefore, if the intermediate layer 2 is too thick, the etching process may become inefficient.

The amount of the injected element in the intermediate layer 2 is more preferably between 0.9 and 10 mg/m$^2$. If the amount is within this range, the manufacturing cost can be reduced and the bonding strength of the conductive layer 4 can be stably enhanced. It should be noted that the amount of the injected element can be measured by the inductively coupled plasma spectrometry (ICP), or any other technique.

The intermediate layer 2 is made of at least one element selected from the group consisting of Mo, Cr, Ni, and Si. Among them, experiments conducted by the present inventor proved that Ni, Mo, and Si provided a great bonding strength, and this high bonding strength was maintained after a durability test.

One or more second intermediate layer that can be adhered with the conductive layer 4 with a high adhesion strength may be formed by evaporated between the intermediate layer 2 and the conductive layer 4. The second intermediate layer is preferably made of copper or a copper alloy containing 98% by weight or more of copper since the adhesion between the film base material and the metal layer can be further improved by using copper while maintaining a high electric conductivity. The second intermediate layer preferably has a thickness of between 5 and 300 nm.

The etching treatment may be either the wet etching or may be the dry etching, and dry etching is preferable because the polyimide surface can be effectively activated with the wet etching. It is preferable to deposit the metal film in an inline processing after the plasma etching treatment is carried out without breaking the vacuum.

In order to form the intermediate layer 2 on the polyimide film 1, it is required that the injected element be bombarded to the polyimide film 1 with higher energy than that is used in the conventional vapor deposition technique. In order to increase the incident energy of the injected element, the following methods may be used. The present invention, however, is not limited these examples.

Figure 3:
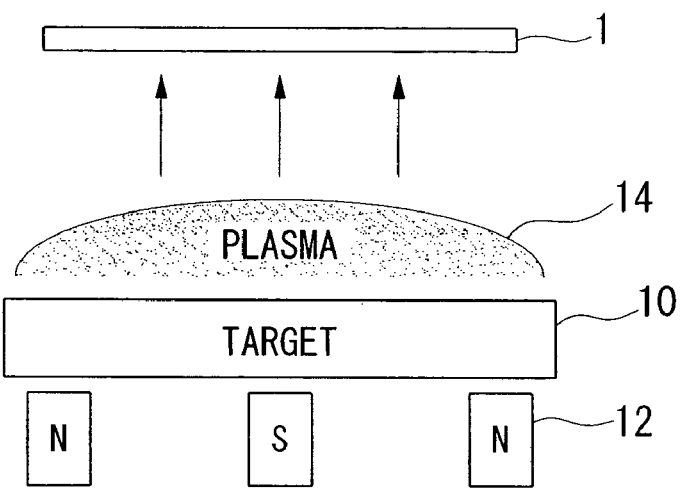
FIG. 3 is a schematic diagram illustrating one example of a process for manufacturing a metallized polyimide film according to the present invention.

(1) Sputtered particles can be accelerated by depositing the film at a higher degree of vacuum so that the plasma generation voltage is increased. This principle will be explained with reference to FIG. 3. Reference numeral 10 denotes a target that is principally made of the element to be injected, and a magnet 12 is provided at the backside of the target. Plasma 14 is generated in proximity to the front surface of the target 10 by the magnetic force of the magnet 12. The plasma 14 strikes the surface of the target 10, the injected element is detached as particles, and the particles are incident on the polyimide film 1 that is placed opposing to the target 10. In this configuration, as the extent of the vacuum is increased, the plasma generation voltage of the plasma 14 increases. As a result, the plasma 14 bombards the target 10 more vigorously and the speed of the sputtered particles emitted from the target 10 is increased. Although the preferable pressure may vary depending on the equipment, the degree of vacuum (ultimate pressure) is preferably $2.7 \times 10^{-1}$ Pa or less in order to increase the speed of the sputtered particles sufficiently.

(2) In magnetron DC sputtering equipment, sputtered particles can be accelerated by reducing the magnetic force of the magnet to lower the plasma density. In the example shown in FIG. 3, the sputtered particles are accelerated by weakening the magnetic force of the magnet 12 to lower the plasma density. In order to increase the speed of the sputtered particles sufficiently, the magnet may be mounted movably so that the distance between the magnet and the target is increased. The optimum distance between the magnet and the target varies depending on the shape of the target and the design of the equipment.

Figure 4:
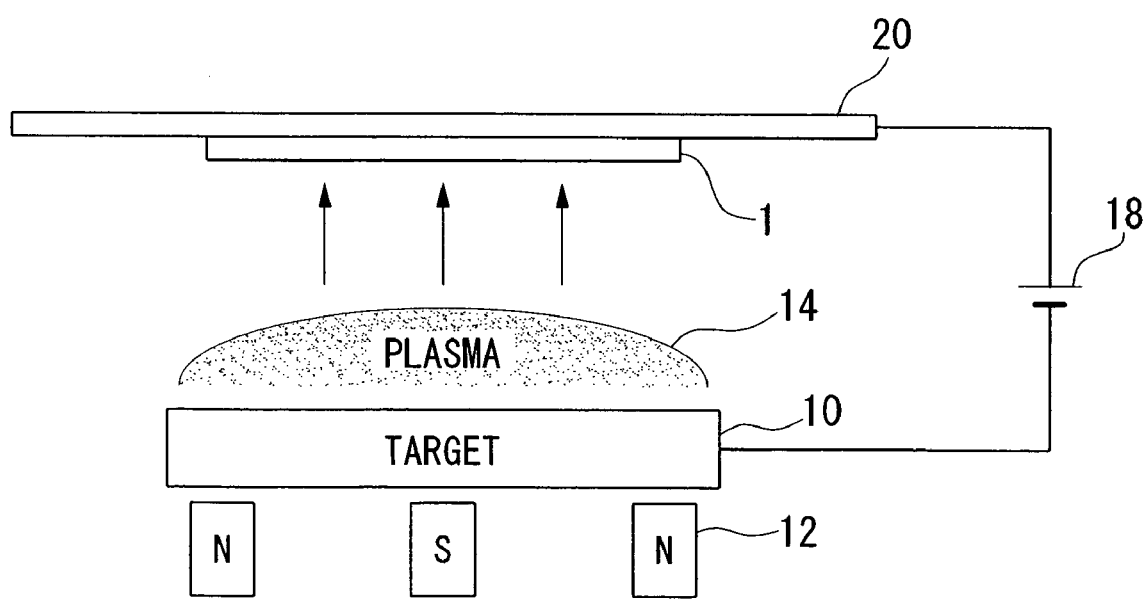
FIG. 4 is a schematic diagram illustrating one example of a process for manufacturing a metallized polyimide film according to the present invention.

(3) An electrode 20 is provided on the back side of the polyimide film 1, and a power supply 18 is connected between the target 10 and the electrode, as shown in FIG. 4. In this configuration, when positive voltage is applied to the electrode 20, it is possible to accelerate the sputtered particles emitted from the target 10 toward the polyimide film 1.

Figure 5:
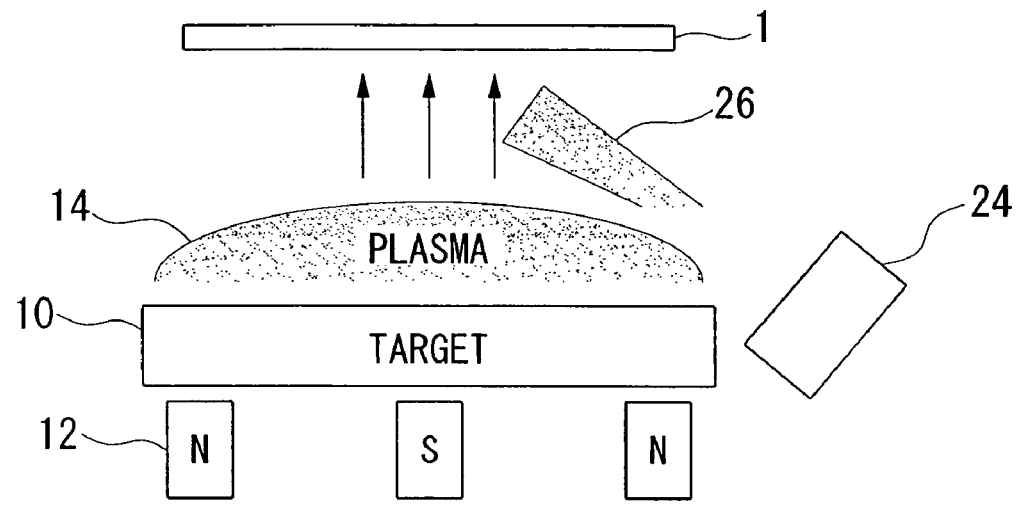
FIG. 5 is a schematic diagram illustrating one example of a process for manufacturing a metallized polyimide film according to the present invention.

(4) Ion beams 26 are irradiated continuously toward the polyimide film 1 from an ion irradiation device 24. Before the sputtered particles emitted from the target 10 reach the polyimide film 1, the ion beams 26 accelerate the sputtered particles toward the particles so that the particles are incident on the polyimide film 1, as shown in FIG. 5. In order to increase the speed of the sputtered particles sufficiently, the average acceleration energy of the ion beams 26 is preferably between 150 and 1800 eV, and is more preferably between 600 and 1800 eV. The plasma voltage is preferably between 250 and 3000 V.

Figure 6:
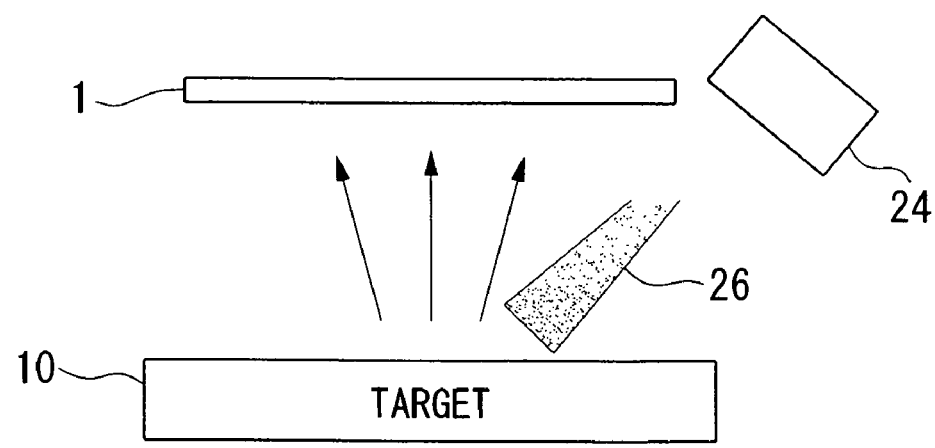
FIG. 6 is a schematic diagram illustrating one example of a process for manufacturing a metallized polyimide film according to the present invention.

(5) Ion beams 26 are irradiated as the plasma source from the ion irradiation device 24 toward the target 10. The particles are sputtered from the target 10 when the ion beams 26 strike the target, and the sputtered particles are incident on the polyimide film 1, as shown in FIG. 6. The average acceleration energy of the ion beams 26 is preferably between 150 and 1800 eV, and is more preferably between 600 and 1800 eV. The plasma voltage is preferably between 250 and 3000 V.

The conductive layer 4 is preferably made of copper or a copper alloy, and pure copper, or a copper alloy containing nickel, zinc, iron, or the like is especially preferable. The conductive layer 4 has a thickness of 10 nm or more, and more preferably has a thickness of 30 nm or more. If the conductive layer 4 is too thick, the production cost is increased, whereas a failure, such as burnout, may easily occur in a plating process if the thickness is small.

The conductive layer 4 may be formed using any known thin film formation techniques, including vacuum evaporation, sputtering, ion plating, or the like. The metal layer 4 may be formed by simply depositing a metal film on the intermediate layer 2 that has been formed on the polyimide film 1. Alternatively, the conductive layer 4 may be formed by depositing a thin metal film using any of known film deposition techniques described above, and then forming another a metal plating layer on the thin film using an electroplating or electroless plating technique.

An oxygen and water barrier film may be provided on the back side of the polyimide film 1. The oxygen and water barrier film may be made of at least one material selected from the group consisting of silicon oxide, aluminum oxide, titanium oxide, tin oxide, indium oxide, magnesium fluoride, magnesium oxide, aluminum, indium tin oxide (ITO). Silicon oxide or aluminum oxide is especially preferable as the material of the oxygen and water barrier film since they exhibit an excellent barrier property against oxygen and water.

The oxygen and water barrier film preferably has a thickness of between 5 and 300 nm. If the thickness is less than 5 mn, a sufficient shield effect against oxygen and water cannot be obtained. In contrast, if the thickness of the oxygen and water barrier film is more than 300 nm, the production cost is increased without further improvement in the shield effect. The oxygen and water barrier film more preferably has a thickness of between 20 and 150 nm. The technique to form the oxygen and water barrier film is not particularly limited, but the physical vapor deposition (PVD), chemical vapor deposition (CVD), or the like, are preferable.

When the oxygen and water barrier film is provided, penetration of oxygen and water from the back side of the polyimide film 1 is prevented even at high temperatures. This prevents oxidation of copper in the conductive layer 4 in the presence of oxygen and water, and the decomposition of the polyimide due to hydrolysis reaction between the resulting copper ions and the polyimide. Thus, in conjunction with the intermediate layer 2, the oxygen and water barrier film prevents peeling off of the conductive layer 4 or the intermediate layer 2 from the polyimide film 1 even when the metallized polyimide film of the present invention is used for a long time at temperatures higher than the temperature at which a conventional metallized polyimide film is used. Thus, a high reliability is achieved. The metallized polyimide film of the present invention is suitably used as on-vehicle components that are often used at high temperatures and high humidity. This advantage can be evaluated using, for example, high temperature environment tests.

Furthermore, in the present invention, after the intermediate layer 2 is formed by disposing very small amounts of specific nucleation elements on the surface of the polyimide film 1, the conductive layer 4 is formed. Thus, the bonding strength between the polyimide film 1 and the conductive layer 4 can be enhanced. This further improves the bonding strength of the conductive layer 4 when the metallized polyimide film is used at high temperatures. In addition, this high bonding strength is obtained both when the intermediate layer 2 is formed on a BPDA-based polyimide and when the intermediate layer 2 is formed on a PMDA-based polyimide.

EXAMPLES

The advantageous effects of the present invention are examined in the following examples.

Example 1

"Upilex-S" (brand name) that is commercially available from UBE Industries, Ltd., having a thickness of 25 µm, was used as the base material of the polyimide film, and the two sides of the film base material were subjected to plasma surface treatment under the following conditions:
Plasma treatment condition: Gas Ar, RF output 1.5 kW, processing time 10 min The film base material was then introduced to sputtering equipment, and the intermediate layer and the conductive layer were deposited under the following conditions:

Intermediate Layer
  Material: Ni—Cr alloy
  Deposition Conditions: Gas Ar, DC power 0.3 kW
  Magnet: ferrite magnet
  Ion beam irradiation: plasma voltage of 1000 V
  Film thickness: 3 nm Conductive Layer
  Material: copper
  Deposition Conditions: Gas Ar, DC power 4.5 kW
  Magnet: ferrite magnet
  Film thickness: 200 nm Furthermore, a copper electroplating layer was formed on the resulting conductive layer in a copper sulfate bath to a thickness of 18 µm to obtain a sample of Example 1.

Comparative Example 1

The same polyimide film base material as Example 1 was used, and the intermediate layer and the conductive layer were formed using conventional sputtering conditions listed below without carrying out the plasma surface treatment. In these conditions, a sufficient amount of elements is not injected into the element injection region of the polyimide film.

Intermediate Layer
  Material: Ni—Cr alloy
  Deposition Conditions: Gas Ar, DC power 0.3 kW
  Magnet: ferrite magnet
  Ion beam irradiation: none
  Film thickness: 3 nm Conductive Layer
  Material: copper
  Deposition Conditions: Gas Ar, DC power 4.5 kW
  Magnet: ferrite magnet
  Film thickness: 200 nm Furthermore, a copper electroplating layer was formed on the resulting conductive layer in a copper sulfate bath to a thickness of 18 µm to obtain a sample of Comparative Example 1.

Evaluations

A strip specimen with a width of 10 mm by a length of 150 mm was cut from each of the metallized polyimide film samples of Example 1 and Comparative Example 1. The peeling off strength (peel strength) between the film base material and the conductive layer of each specimen was evaluated according to the test method prescribed in IPC-TM-650 (test method manual by ICP). In this test, the polyimide film side of a strip specimen is adhered to an outer rim of a 6-inch-diameter drum, and the load (kN/m) required to peel off the metal film from the polyimide film was measured by pulling one end of the metal film with a tool while peeling off the metal film from the specimen at an angle of 90° with respect to the polyimide film at a speed of 5 cm/min.

The peeling off strength of each of the specimens from Example 1 and Comparative Example 1 were measured after the test samples were subjected to a heat treatment. In the heat treatment, the specimens were heated at 150° C. in the air for 168 hours.

Furthermore, peeling off strength of each of the specimens from Example 1 and Comparative Example 1 were measured after the specimens were subjected to a high-pressure and high humidity treatment (known as "the pressure cooker test (PCT) treatment"). The condition of the PCT treatment was such that the specimens were allowed to stand at a temperature of 121° C. and a humidity of 100% for 48 hours.

The results are listed in Table 1.

TABLE 1

| | Peel Strength (kN/m) | | |
|---|---|---|---|
| | No treatment | 150° C. | PCT |
| Example 1 | 1.21 | 0.40 | 0.99 |
| Comparative Example 1 | 0.72 | 0.20 | 0.20 |

As shown in Table 1, all specimens of Example 1 exhibited a high peel strength after both the heat treatment and the PCT treatment.

Figure 7:
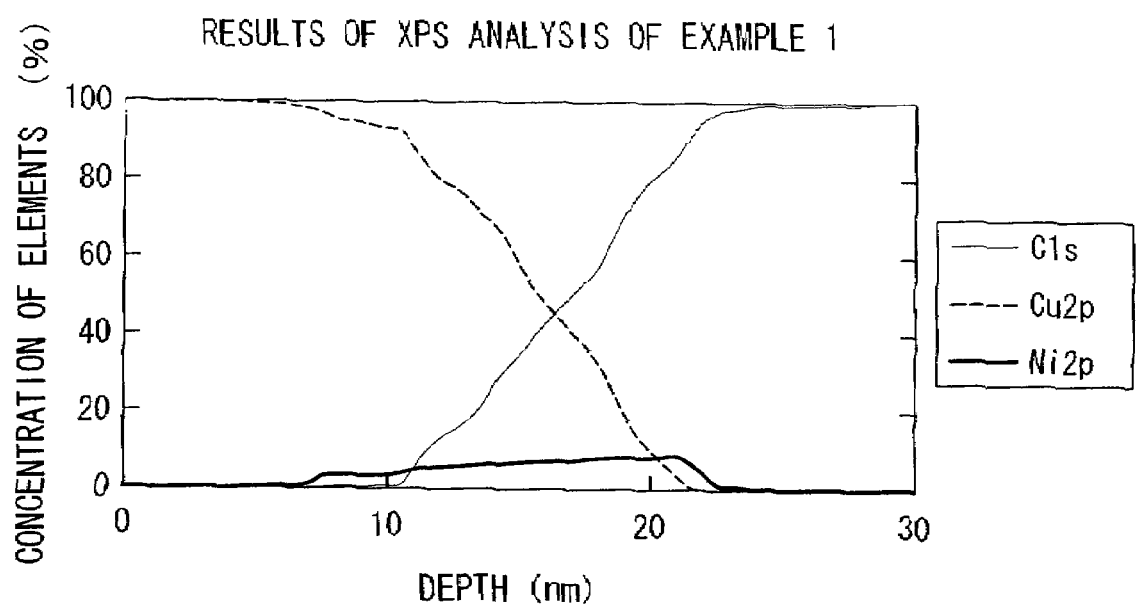
FIG. 7 is a graph illustrating the concentration profiles of carbon, copper, and nickel in the metallized polyimide film of Examples of the present invention.
Figure 8:
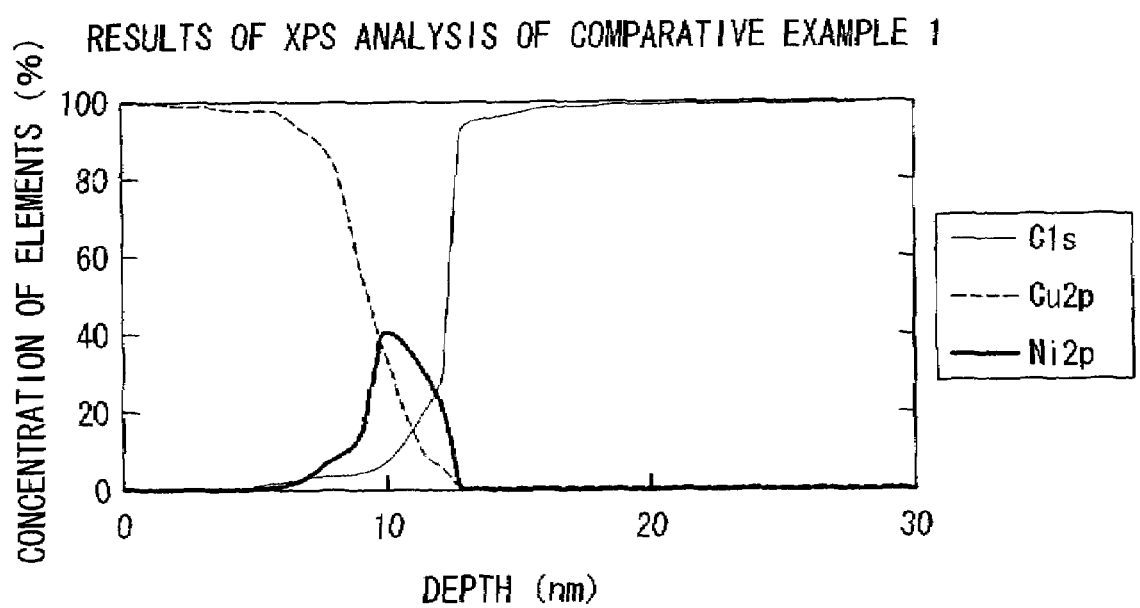
FIG. 8 is a graph illustrating the concentration profiles of carbon, copper, and nickel in the metallized polyimide film of Comparative Examples of the present invention.

FIG. 7 is a graph illustrating the results of concentration profiles of carbon (1s), copper (2p), and nickel (2p) in the intermediate layer 2 and in the vicinity thereof in the sample of Example 1 when analyzed using X-ray photoelectron spectroscopy (XPS). FIG. 8 is a graph illustrating the results of concentration profiles in Comparative Example 1 when analyzed using the same test procedure as the test of FIG. 7. FIG. 7 indicates that the injected elements were penetrated to the element injection region in the polyimide film of Example 1, which contributes to an excellent bonding strength. In contrast, the injected elements were not sufficiently penetrated to the element injection region in the polyimide film of Comparative Example 1 shown in FIG. 8. It is believed that this is the reason the bonding strength of Comparative Example was not as high as that in Example 1.

According to the present invention, by providing an intermediate layer into which at least one element selected from the group consisting of Mo, Cr, Ni, and Si is injected in a region in the polyimide film that is adjacent to the surface thereof, it is possible to enhance the adhesion between the intermediate layer and the polyimide film. Accordingly, it is possible to prevent peeling off of the conductive layer from the polyimide film, and a high reliability is ensured.

While preferred embodiments of the invention have been described and illustrated above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A metallized polyimide film comprising:
   a polyimide film;
   an intermediate layer formed in the polyimide film, the intermediate layer including at least one element selected from the group consisting of Mo, Cr, Ni, and Si dispersed into the polyimide film to a depth of 20 nm or less from a surface of the polyimide film; and
   a conductive layer that is made of copper or a copper alloy formed on the intermediate layer,
   wherein the amount of the at least one element dispersed into the intermediate layer is between 0.3 and 15 mg/m$^2$.

2. The metallized polyimide film according to claim 1, wherein the intermediate layer is made of polyimide and at least one element selected from the group consisting of Mo, Cr, Ni, and Si.

3. The metallized polyimide film according to claim 2, wherein the intermediate layer has a concentration gradient in which a concentration of the at least one element selected from the group consisting of Mo, Cr, Ni, and Si is higher in the vicinity of the conductive layer and a concentration of the polyimide is higher in the vicinity of the polyimide film.

4. A method for manufacturing a metallized polyimide film, comprising the steps of:
   providing a polyimide film;
   forming an intermediate layer by sputtering particles from a target containing at least one element selected from the group consisting of Mo, Cr, Ni, and Si, so as to disperse the sputtered particles into the polyimide film to a depth of 20 nm or less from a surface of the polyimide film, the amount of the at least one element dispersed into the intermediate layer being between 0.3 and 15 mg/m$^2$; and
   forming a conductive layer that is made of copper or a copper alloy on the intermediate layer.

5. The method for manufacturing a metallized polyimide film according to claim 4, wherein the step of forming the intermediate layer comprises accelerating the sputtered particles by increasing a degree of vacuum.

6. The method for manufacturing a metallized polyimide film according to claim 4, wherein the step of forming the intermediate layer comprises accelerating the sputtered particles by lowering a plasma density.

7. The method for manufacturing a metallized polyimide film according to claim 4, wherein the step of forming the intermediate layer comprises accelerating the sputtered particles by applying positive voltage to an electrode provided on a back side of the polyimide film.

8. The method for manufacturing a metallized polyimide film according to claim 4, wherein the step of forming the intermediate layer comprises accelerating the sputtered particles by means of ion beams.

9. The method for manufacturing a metallized polyimide film according to claim 4, wherein the step of forming the intermediate layer comprises accelerating the sputtered particles by irradiating the target with ion beams.

10. The method for manufacturing a metallized polyimide film according to claim 4, further comprising the step of making the surface of the polyimide film rough by means of an etching treatment prior to the step of forming the intermediate layer.

* * * * *